United States Patent
Chen et al.

(10) Patent No.: US 9,343,435 B2
(45) Date of Patent: May 17, 2016

(54) SEMICONDUCTOR DEVICE AND RELATED MANUFACTURING METHOD

(71) Applicant: Semiconductor Manufacturing International (Shanghai) Corporation, Shanghai (CN)

(72) Inventors: Fucheng Chen, Shanghai (CN); Yao Liu, Shanghai (CN); Herb He Huang, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 36 days.

(21) Appl. No.: 14/459,962

(22) Filed: Aug. 14, 2014

(65) Prior Publication Data
US 2015/0187736 A1    Jul. 2, 2015

(30) Foreign Application Priority Data

Dec. 31, 2013 (CN) .......................... 2013 1 0753305

(51) Int. Cl.
| | |
|---|---|
| *H01L 21/44* | (2006.01) |
| *H01L 25/065* | (2006.01) |
| *H01L 25/00* | (2006.01) |
| *H01L 23/00* | (2006.01) |

(52) U.S. Cl.
CPC ............ *H01L 25/0657* (2013.01); *H01L 24/09* (2013.01); *H01L 24/89* (2013.01); *H01L 25/50* (2013.01); *H01L 2224/0382* (2013.01); *H01L 2224/03614* (2013.01); *H01L 2224/08145* (2013.01); *H01L 2224/80355* (2013.01); *H01L 2225/06513* (2013.01); *H01L 2924/06* (2013.01); *H01L 2924/12042* (2013.01); *H01L 2924/14* (2013.01); *H01L 2924/20104* (2013.01); *H01L 2924/20105* (2013.01); *H01L 2924/20108* (2013.01); *H01L 2924/20109* (2013.01)

(58) Field of Classification Search
CPC ................. H01L 2924/12042; H01L 2924/14; H01L 2924/06513; H01L 2924/20104; H01L 25/0657; H01L 25/50; H01L 24/09; H01L 24/89
USPC .................................. 257/778, 774, 758, 777
See application file for complete search history.

(56) References Cited

U.S. PATENT DOCUMENTS

| | | | | |
|---|---|---|---|---|
| 2014/0374922 A1* | 12/2014 | Huang | ................ | H01L 23/3128 257/777 |
| 2015/0179605 A1* | 6/2015 | Dubey | .................... | H01L 24/80 257/777 |

* cited by examiner

*Primary Examiner* — Hoa B Trinh
(74) *Attorney, Agent, or Firm* — Innovation Counsel LLP (57) ABSTRACT

A method for manufacturing a semiconductor device may include providing a first dielectric layer and a first set of conductive pads on a first substrate. Each conductive pad of the first set of conductive pads may be positioned between portions of the first dielectric layer. The method may further include providing a first insulating material layer to cover the first dielectric layer and the first set of conductive pads. The method may further include removing portions of the first insulating material layer to form a first insulating layer. Openings of the first insulating layer may expose the first set of conductive pads.

16 Claims, 7 Drawing Sheets

SEMICONDUCTOR DEVICE AND RELATED MANUFACTURING METHOD

CROSS-REFERENCE TO RELATED APPLICATION

This application claims priority to and benefit of Chinese Patent Application No. 201310753305.5, filed on 31 Dec. 2013, the Chinese Patent Application being incorporated herein by reference in its entirety.

BACKGROUND OF THE INVENTION

The present invention is related to a semiconductor device, a method for manufacturing the semiconductor device, and a method for packaging the semiconductor device.

In consumer electronics, multifunctional electronic devices have become popular. For integrating chips of various functions on a circuit board of a multifunctional electronic device, a three-dimensional integrated circuit (3D IC) structure may be implemented.

In a 3D IC structure, chips may be stacked vertically and may be interconnected through leads and metal lines. The metal lines may undesirably complicate and/or enlarge the circuit board. For simplifying and/or minimizing a 3D IC structure, wafer-level copper-copper (Cu—Cu) bonding may be implemented.

Figure 2:
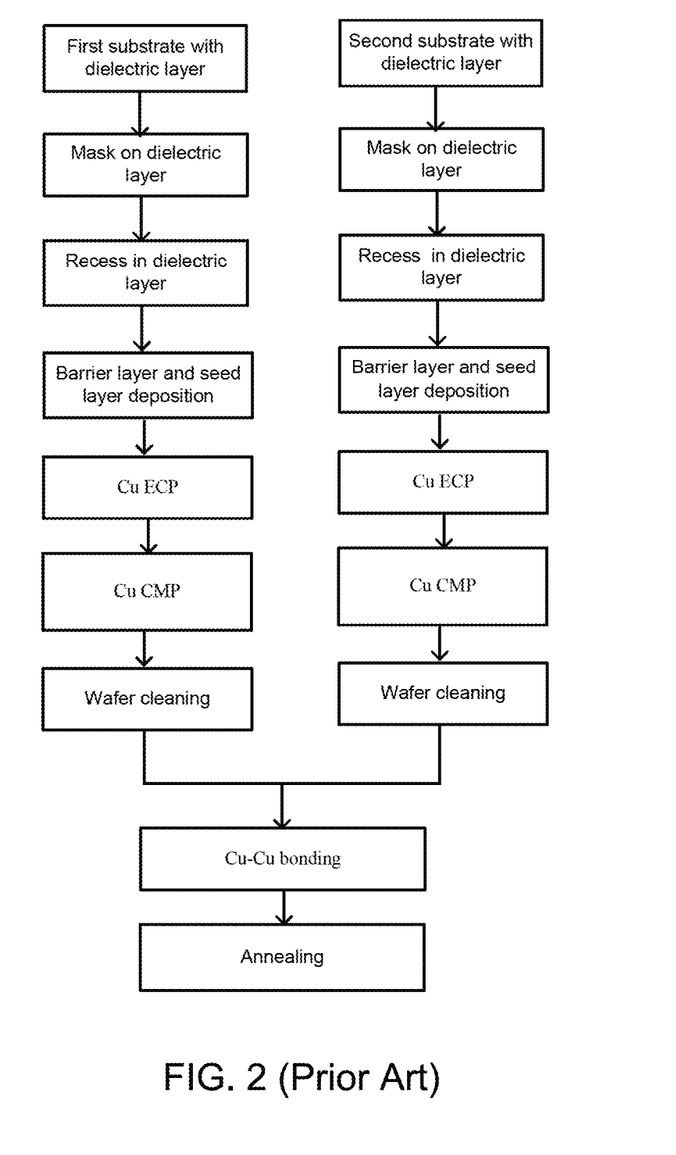
FIG. 2 shows a flowchart that illustrates a wafer-level Cu—Cu bonding process.
Figure 3:
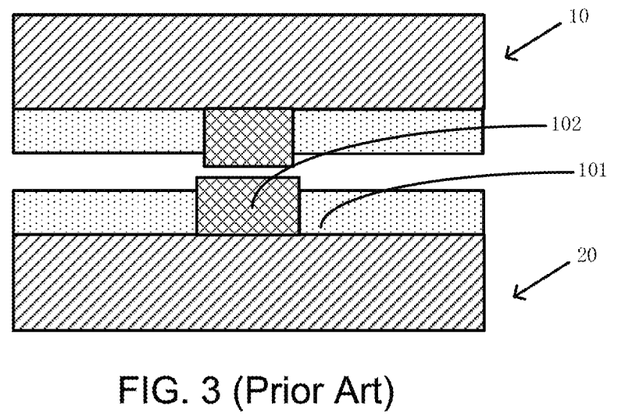
FIG. 3 shows a schematic cross-sectional view that illustrates portions of two wafers involved in a wafer-level Cu—Cu bonding process.

FIG. 2 shows a flowchart that illustrates a wafer-level Cu—Cu bonding process. FIG. 3 shows a schematic cross-sectional view that illustrates a portion of a first wafer 10 and a portion of a second wafer 20 involved in the wafer-level Cu—Cu bonding process. Referring to FIG. 2, the process may include preparing two substrates, including a first substrate and a second substrate. For each of the wafers, the process may further include the following steps: forming an interlayer dielectric layer on the substrate, forming a mask on the interlayer dielectric layer, using the mask for patterning the interlayer dielectric layer to form a recess, forming a barrier layer and a seed layer in the recess (through deposition), forming a copper (Cu) member in the recess through electroplating (ECP), planarizing the Cu member through chemical-mechanical polishing/planarization (CMP) to form a Cu pad, and cleaning the wafer that includes the Cu pad.

As a result, the first wafer 10 and the second wafer 20 illustrated in FIG. 3 may be formed. Each of the first wafer 10 and the second wafer 20 may include an interlayer dielectric layer and a Cu pad embedded in the interlayer dielectric layer. For example, the second wafer 20 may include an interlayer dielectric layer 101 and a Cu pad 102 embedded in the interlayer dielectric layer 101. Each wafer may further include other Cu pads that are analogous to the Cu pad 102.

The wafer-level Cu—Cu bonding process may further include combining the Cu pads of the wafer 101 and the Cu pads of the wafer 102 through low-temperature thermocompression bonding. The process may further include performing annealing on the combined structure.

Figure 1A:
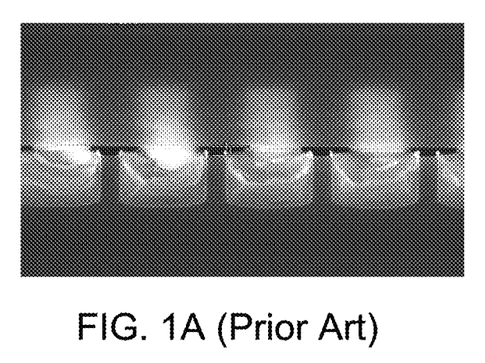
FIG. 1A shows a diagram that illustrates a cross-section of a portion of a wafer combination involving face-to-face stacking of two wafers.
Figure 1B:
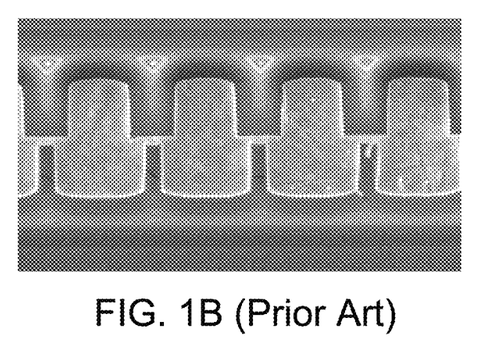
FIG. 1B shows a diagram that illustrates a cross-section of a portion of a wafer combination involving face-to-face stacking of two wafers.

Given that spaces between Cu pads may be substantially small and that Cu has substantial ductility, as illustrated in FIG. 1B, unwanted connections may be formed as a result of the thermocompression bonding. FIG. 1B shows a diagram that illustrates a cross-section of a portion of a wafer combination involving face-to-face stacking of two wafers. In the wafer combination illustrated in FIG. 1B, unwanted connections may be formed as a result of combining Cu pads through thermocompression bonding. As a result, undesirable short circuits may occur in semiconductor devices that are manufactured using the wafer combination, such that the semiconductor devices may be defective.

FIG. 1A shows a diagram that illustrates a cross-section of a portion of a wafer combination involving face-to-face stacking of two wafers. The wafer combination illustrated in FIG. 1A may have substantially no unwanted short circuits. Nevertheless, a result of combining Cu pads through thermocompression bonding, defects may be formed in Cu pads of the wafer combination illustrated in FIG. 1A. As a result, reliability of semiconductor devices manufactured using the wafer combination may be unsatisfactory.

SUMMARY

An embodiment of the present invention may be related to a method for manufacturing a semiconductor device. The method may include providing a first dielectric layer and a first set of conductive pads on a first substrate. Each conductive pad of the first set of conductive pads may be positioned between portions of the first dielectric layer. The method may further include providing a first insulating material layer to cover the first dielectric layer and the first set of conductive pads. The method may further include removing portions of the first insulating material layer to form a first insulating layer. Openings of the first insulating layer may expose the first set of conductive pads.

The first insulating layer may include at least one of a benzocyclobutene material and a silicone-polymer material.

The method may include forming a first dielectric material layer on the first substrate. The method may further include etching the first dielectric material layer to form the first dielectric layer. A thickness of the first dielectric layer may be less than a thickness of the first dielectric material layer.

The first insulating material layer may be formed on the first dielectric layer and the first set of conductive pads through spin coating.

The openings may include a first opening. The first set of conductive pads may include a first conductive pad exposed by the first opening. A critical dimension of the first opening of the first insulating layer may be greater than a critical dimension of the first conductive pad, such that a first gap may be provided between the first conductive pad and the first insulating layer.

The first insulating layer may not directly contact the first set of conductive pads.

A first portion of the first insulating layer may be positioned between at least two conductive pads of the first set of conductive pads. A second portion of the first insulating layer may directly contact an edge portion of the first dielectric layer. At least one conductive pad of the first set of conductive pads may be positioned between the first portion of the first insulating layer and the second portion of the first insulating layer. The second portion of the first insulating layer may be narrower than the edge portion of the first dielectric layer in a direction parallel to an interface between the first insulating layer and the first dielectric layer.

The step of removing the portions of first insulating material layer may include the following steps: forming a mask material layer on the first insulating material layer, the mask material layer including at least one of a first photoresist layer, an organic distribution layer, and a silicon-containing bottom antireflective coating; forming a patterned photoresist layer on the mask material layer; etching the mask material layer using the patterned photoresist layer to form a mask; and etching the first insulating material layer using the mask. As a result, the openings of the first insulating layer may be formed.

A height of the first insulating layer with respect to the first substrate may be greater than a height of the first set of conductive pads with respect to the first substrate. Therefore, a bonding process involving the first insulating layer may precede a bonding process involving the first set of conductive pads.

The method may include the following steps: providing a second dielectric layer and a second set of conductive pads on a second substrate, each conductive pad of the second set of conductive pads being positioned between portions of the second dielectric layer; providing a second insulating material layer to cover the second dielectric layer and the second set of conductive pads; and removing portions of the second insulating material layer to form a second insulating layer, opening of the second insulating layer exposing the second set of conductive pads; connecting the first insulating layer to the second insulating layer; and after the connecting the first insulating layer to the second insulating layer, connecting the first set of conductive pads to the second set of conductive pads.

At least one of the first insulating layer and the second insulating layer may be formed of benzocyclobutene. The step of connecting the first insulating layer to the second insulating layer may be performed at a temperature in a range of 100° C. to 150° C. for a time duration in a range of 10 minutes to 30 minutes using a pressure in a range of 30 kN to 60 kN.

At least one of the first insulating layer and the second insulating layer may be formed of a silicone-polymer material. The step of connecting the first insulating layer to the second insulating layer may be performed at a temperature in a range of 150° C. to 180° C. for a time duration in a range of 10 minutes to 30 minutes using a pressure in a range of 30 kN to 60 kN.

The step of connecting the first set of conductive pads to the second set of conductive pads is performed at a temperature in a range of 300° C. to 400° C. for a time duration in a range of 20 minutes to 60 minutes using a pressure in a range of 30 kN to 40 kN.

The method may include the following steps: providing a second dielectric layer and a second set of conductive pads on a second substrate, each conductive pad of the second set of conductive pads being disposed between portions of the second dielectric layer; connecting the first insulating layer to the second dielectric layer; and after the connecting the first insulating layer to the second dielectric layer, connecting the first set of conductive pads to the second set of conductive pads.

The first insulating layer may be formed of benzocyclobutene. The step of connecting the first insulating layer to the second insulating layer may be performed at a temperature in a range of 100° C. to 150° C. for a time duration in a range of 10 minutes to 30 minutes using a pressure in a range of 30 kN to 60 kN.

The first insulating layer may be formed of a silicone-polymer material. The step of connecting the first insulating layer to the second insulating layer may be performed at a temperature in a range of 150° C. to 180° C. for a time duration in a range of 10 minutes to 30 minutes using a pressure in a range of 30 kN to 60 kN.

An embodiment of the present invention may be related to a semiconductor device that may include a first substrate and a second substrate. The semiconductor device may further include a first conductive pad and a second conductive pad (each being a combination of two conductive pads and each being positioned between the first substrate and the second substrate). The semiconductor device may further include a first dielectric layer formed of a first material (e.g., an oxide), a first portion of the first dielectric layer being positioned between the first conductive pad and the second conductive pad and directly contacting each of the first conductive pad and the second conductive pad. The semiconductor device may further include a second dielectric layer, a first portion of the second dielectric layer being positioned between the first conductive pad and the second conductive pad and directly contacting each of the first conductive pad and the second conductive pad. The semiconductor device may further include an insulating layer formed of a second material different from the first material, a first portion of the insulating layer being positioned between the first portion of the first dielectric layer and the first portion of the second dielectric layer and being positioned between the first conductive pad and the second conductive pad. The insulating layer may represent a combination of two insulating layers of two combined wafers or may represent the insulating layer of one of two combined wafers. The second material may include at least one of a benzocyclobutene material and a silicone-polymer material.

The first portion of the insulating layer may be narrower than each of the first portion of the first dielectric layer and the first portion of the second dielectric layer in a direction parallel to an interface between the insulating player and the first dielectric layer. The first portion of the insulating layer may be spaced from all conductive pads of the semiconductor device and may not directly contact any conductive pad of the semiconductor device.

An edge portion of the insulating layer may be positioned at an edge of the semiconductor device, may directly contact each of an edge portion of the first dielectric layer and an edge portion of the second dielectric layer, and may be narrower than each of the edge portion of the first dielectric layer and the edge portion of the second dielectric layer in a direction parallel to an interface between the insulating layer and the first dielectric layer. The edge portion of the insulating layer may be spaced from all conductive pads of the semiconductor device and may not contact any conductive pad of the semiconductor device.

The above summary is related to one or more of many embodiments of the invention disclosed herein and is not intended to limit the scope of the invention.

DETAILED DESCRIPTION

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 5A:
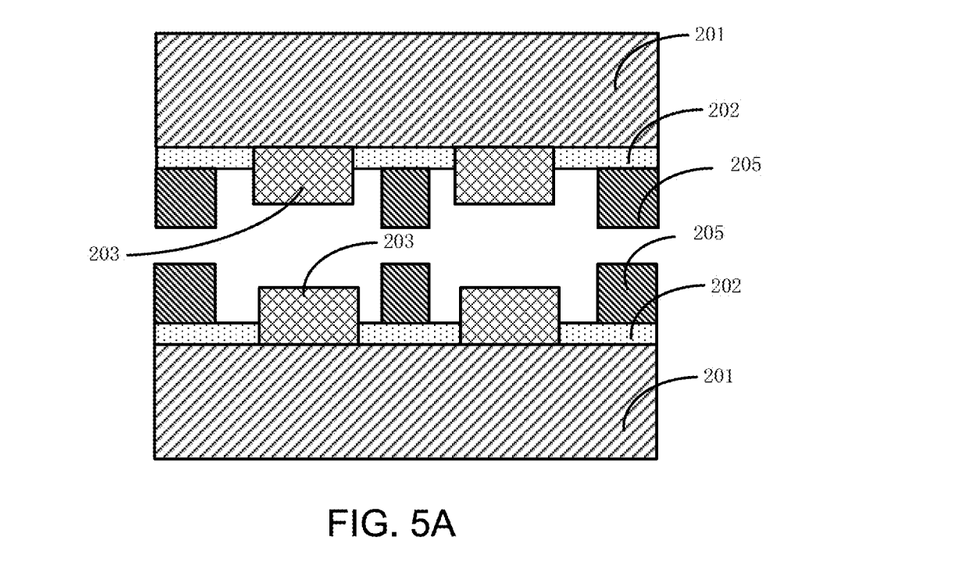
FIG. 5A and FIG. 5B show schematic cross-sectional views that illustrate portions of two wafers involved in a wafer-level Cu—Cu bonding process in accordance with an embodiment of the present invention.
Figure 5B:
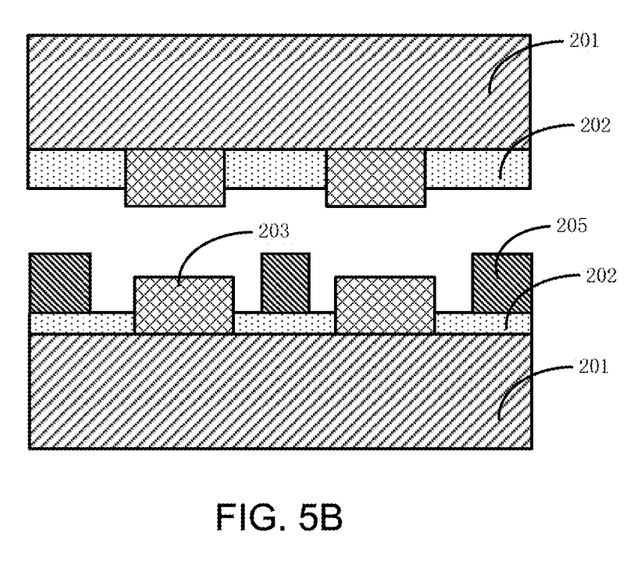
Figure 6:
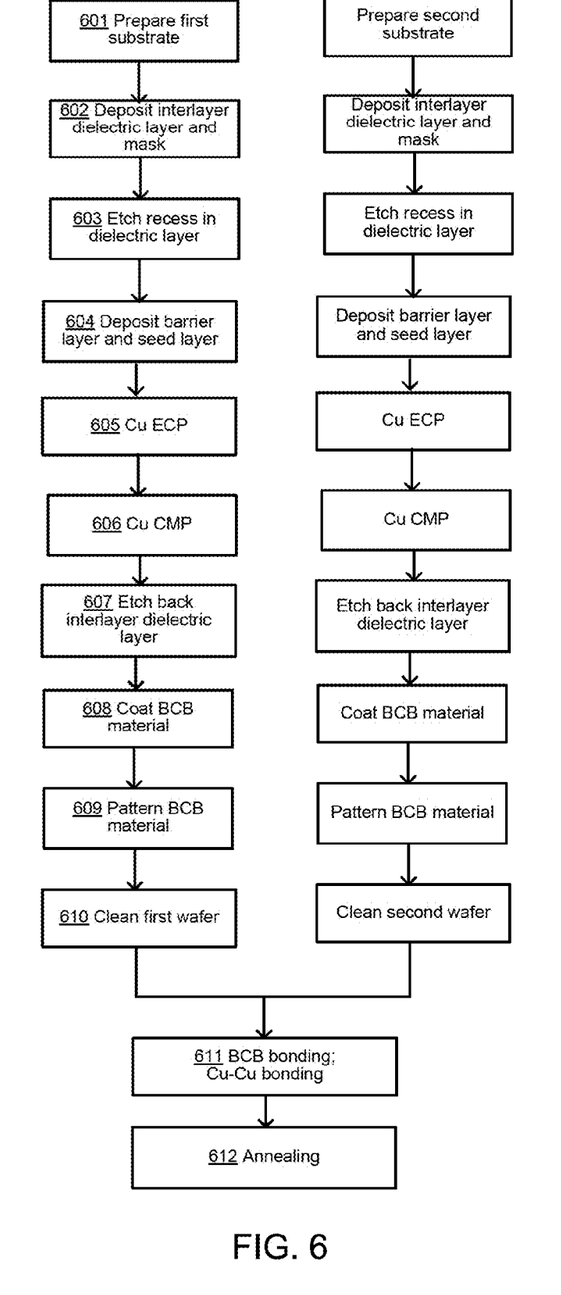
FIG. 6 shows a flowchart that illustrates a method involving a wafer-level Cu—Cu bonding process for combining two wafers in accordance with an embodiment of the present invention.

FIG. 4A, FIG. 4B, FIG. 4C, and FIG. 4D show schematic cross-sectional views that illustrate a portion of a wafer prepared for a wafer-level Cu—Cu bonding process in accordance with an embodiment of the present invention. FIG. 5A and FIG. 5B show schematic cross-sectional views that illustrate portions of two wafers involved in a wafer-level Cu—Cu bonding process in accordance with an embodiment of the present invention. FIG. 6 shows a flowchart that illustrates a method involving a wafer-level Cu—Cu bonding process for combining two wafers in accordance with an embodiment of the present invention. The method may be implemented for packaging semiconductor wafers (which include integrated circuits) and/or for manufacturing semiconductor devices.

Referring to FIG. 6, the method may include preparing a first wafer and a second wafer. The first wafer may be prepared using steps 601 to 610. The second wafer may be prepared using steps that are substantially analogous to steps 601 to 610. After both the first wafer and the second wafer have been prepared, in a step 611, the first wafer may be combined with the second wafer through Cu—Cu bonding, such that a wafer combination may be produced. Subsequently, in a step 612, annealing may be performed on the wafer combination.

Figure 4A:
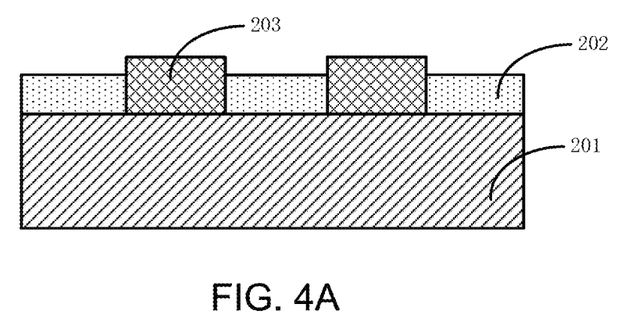
FIG. 4A, FIG. 4B, FIG. 4C, and FIG. 4D show schematic cross-sectional views that illustrate a portion of a wafer prepared for a wafer-level Cu—Cu bonding process in accordance with an embodiment of the present invention.

Referring to FIG. 6 and FIG. 4A, in the step 601, a (first or second) substrate 201 may be prepared. The substrate 201 may include active devices and interconnection structures.

The substrate 201 may include a base substrate. The base substrate may include at least one of the following materials and/or structures: silicon, a silicon-on-insulator (SOI) structure, a silicon-on-silicon-on-insulator (SSOI) structure, a silicon-on-silicon-germanium-on-insulator (S—SiGeOI), a silicon-germanium-on-insulator (SiGeOI) structure, etc.

The base substrate may be a semiconductor base substrate and may include active devices and interconnection structures. The semiconductor base substrate may include a through-silicon via (TSV) structure.

A method for forming the TSV structure may include the following steps: forming a mask layer (e.g., a hard mask layer) on a semiconductor base substrate material member, patterning the mask layer to form an opening in the mask layer, etching the semiconductor base substrate material member through the opening to form a TSV recess. The etching may be performed using dry etching or wet etching.

The method for forming the TSV structure may further include forming an isolation layer (e.g., an insulation layer) in the TSV recess. The isolation layer may be formed using a thermal oxidation method. The isolation layer may be a $SiO_2$ layer. A thickness of the isolation layer may be in a range of 8 angstroms (Å) to 50 Å.

The thermal oxidation may be performed using a conventional rapid thermal oxidation method. For performing the thermal oxidation, $O_2$ or an $O_2$-containing atmosphere may be used in heat-treating the structure that includes the TSV recess. The heat treatment (or thermal oxidation) temperature may be in a range of 800° C. to 1500° C. In an embodiment, the heat treatment (or thermal oxidation) temperature may be in a range of 1100° C. to 1200° C. The heat treatment (or thermal oxidation) time duration may be in a range of 2 minutes to 30 minutes. As a result of the heat treatment (or thermal oxidation), a TSV recess oxide layer may be formed in the TSV recess for functioning as the isolation layer, and a base substrate oxide layer may be formed on the base substrate structure. A thickness of the TSV recess oxide layer (i.e., the isolation layer) and/or a thickness of the base substrate oxide layer may be in a range of 2 Å to 8 Å. In an embodiment, the thickness of at least one of the oxide layers may be 5 Å.

The method for forming the TSV structure may further include filling a conductive material in the TSV recess. The conductive material may be a metal, such as copper (Cu). The conductive material may be filled in the TSV recess using a physical vapor deposition (PVD) method and/or using an electrochemical plating (ECP) method.

The method for forming the TSV structure may further include planarizing the conductive material that has been filled in the TSV recess. The planarization may be performed using a mechanical planarization method and/or a chemical-mechanical planarization (CMP) method. As a result, a TSV base substrate that includes the TSV structure may be formed.

Subsequently, interconnection structures may be formed in the TSV base substrate. One or more interconnection structures may be formed on the TSV structure. One or more interconnection structures may be formed at a via on an active device, an interlayer metal layer via, and/or a top via of the TSV base substrate. As a result, the substrate 201 may be formed.

As an example, the via on the active device may be formed using the following steps: depositing an interlayer dielectric layer on the semiconductor base substrate, patterning the interlayer dielectric layer to form an opening that exposes the active device, filling a conductive material in the opening, and planarizing the filled conductive material. As a result, an electrical connection to the active device in the semiconductor base substrate may be provided. The interlayer metal layer and/or the top via may be formed using a method analogous to the method for forming the via on the active device. Additionally or alternatively, one or more of the vias may be formed using one or more well-known methods.

Subsequently, referring to FIG. 6 and FIG. 4A, in step 602, an interlayer dielectric layer 202 material may be formed (e.g., deposited) on the substrate 201, and a mask may be formed on the interlayer dielectric layer 202 material. In step 603, the dielectric layer 202 material may be etched and/or patterned through a pattern (e.g., an opening) of the mask such that a recessed dielectric layer 202 material that has a recess may be formed. The interlayer dielectric layer 202 material may include a conventional dielectric material. In an embodiment, the interlayer dielectric layer 202 material may include $SiO_2$.

The interlayer dielectric layer 202 material may be formed on the substrate 201 using one or more of the following methods: a chemical vapor deposition (CVD) method, a physical vapor deposition (PVD) method, an atomic layer deposition (ALD) method, a low pressure chemical vapor deposition (LPCVD) method, a laser ablation deposition (LAD) method, and a selective epitaxial growth (SEG) method. In an embodiment, a CVD method may be used for depositing the interlayer dielectric layer 202 material on the substrate 201.

The formation of the mask on the interlayer dielectric layer 202 material may include the following steps: forming a mask material layer that includes at least one of a first photoresist layer, an organic distribution layer (ODL), and a silicon-containing bottom antireflective coating (Si-BARC) on the interlayer dielectric layer 202; forming a patterned photoresist layer on the mask material layer, wherein a pattern (e.g., an opening) of the patterned photoresist layer may define a shape of the recess; and etching the mask material layer through the pattern of the patterned photoresist layer to form the mask. The mask may have a pattern (e.g. an opening) that corresponds to a shape of the recess to be formed.

In step 603, the dielectric layer 202 material may etched and/or patterned through the pattern of the mask such that a recessed dielectric layer 202 material that has the recess may be formed.

The shape of the recess and/or the number of recesses formed may be determined according to particular embodiments. In an embodiment, the critical dimension of the upper opening of the recess may be equal to the critical dimension of the lower opening of the recess. In an embodiment, the critical dimension of the upper opening of the recess may be greater than the critical dimension of the lower opening of the recess.

The recess may be formed through a dry etching method and/or a wet etching method. In an embodiment, a CF etchant may be used for etching the dielectric layer 202 material. The C—F etchant may include one or more of $CF_4$, $CHF_3$, $C_4F_8$, and $C_5F_8$. In an embodiment, dry etching may be performed using $CF_4$, $CHF_3$, and at least one of $N_2$, $CO_2$, and $O_2$ to form an etching atmosphere, with the following gas flow rates: a $CF_4$ flow rate in a range of 10 sccm to 200 sccm, a $CHF_3$ flow rate in a range of 10 sccm to 200 sccm, a $N_2$, $CO_2$, and/or $O_2$ flow rate in a range of 210 sccm to 400 sccm. The etching pressure may be in a range of 30 mTorr to 150 mTorr. The etching time duration may be in a range of 5 seconds to 120 seconds. In an embodiment, the etching time duration may be in a range of 5 seconds to 60 seconds. In an embodiment, the etching time duration may be in a range of 5 seconds to 30 seconds.

A plurality of recesses may be formed substantially simultaneously in an analogous manner.

Subsequently, referring to FIG. 6 and FIG. 4A, in step 604, a barrier layer and a pad material seed layer (e.g., a copper seed layer) may be formed (e.g., deposited) in the recess for forming a conductive bonding pad 203.

In step 604, a barrier layer (not shown) may be formed in the recess for preventing potential diffusion of metal, e.g., copper (Cu). The barrier layer may be a Cu diffusion barrier layer for preventing Cu diffusion. The barrier layer may be formed through at least one of a physical vapor deposition method and a chemical vapor deposition method. In an embodiment, the barrier layer may be formed through at least one of evaporation, electron beam evaporation, plasma spray deposition, and sputtering. In an embodiment, the barrier layer may be formed through plasma spray deposition and sputtering. The thickness of the copper diffusion barrier layer may be configured according to particular embodiments. A material of the barrier layer may include one or more of TaN, Ta, TiN, and Ti, for reducing or minimizing the RC time delay potentially caused by parasitic resistance and parasitic capacitance. In an embodiment, the barrier layer may be made of TaN and/or Ta.

A plurality of barrier layers may be formed substantially simultaneously in an analogous manner.

In step 604, after the barrier layer has been formed, a metal Cu seed layer may be subsequently deposited inside the recess and may be surrounded by the barrier layer. The deposition of the Cu seed layer may be performed using at least one of a chemical vapor deposition (CVD), a physical vapor deposition (PVD) method, and an atomic layer deposition (ALD) method.

Subsequently, in step 605, a metal Cu body may be formed over the metal Cu seed layer through electrochemical plating (ECP) to substantially fill the recess. One or more additives, such as one or more of a leveler, an accelerator, and a suppressor, may be used in the ECP process. In an embodiment, after the metal Cu body has been formed, an annealing process may be performed on the metal Cu body to cause Cu re-crystallization and grain growth in the Cu body, for reducing the resistance of the Cu body and/or for enhancing the stability of the Cu body. The annealing may be performed at temperature in a range of 80° C. to 160° C. for a time duration in a range of 2 hours to 4 hours.

Subsequently, in step 606, planarization may be performed on the metal Cu body (and the barrier layer) to obtain a bonding pad 203 that has a substantially uniform height. The planarization may be performed through chemical-mechanical planarization/polishing (CMP). A plurality of bonding pads 203 may be formed substantially simultaneously in an analogous manner. The bonding pad(s) 203 may have a larger height than the interlayer dielectric layer 202 and may protrude over the interlayer dielectric layer 202.

Figure 4B:
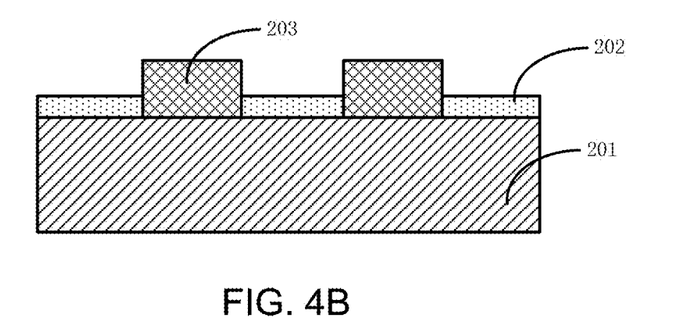

Subsequently, referring to FIG. 6, FIG. 4A, and FIG. 4B, in step 607, a portion of the recessed dielectric layer 202 material may be selectively etched to reduce the dielectric material layer thickness, such that the inter layer dielectric layer 202 may be formed. The etching of the recessed dielectric layer 202 material may be performed using at least one of dry etching and wet etching.

In an embodiment, dry etching process may be performed in step 607, and a SICONI™ etch process may be performed. The SICONI™ etch process may provide desirable etch selectivity between the recessed dielectric layer 202 material, the bonding pads 203, and the barrier layers. Specific parameters for the SICONI™ etch process may be configured according to particular embodiments.

In an embodiment, wet etching may be performed in step 607, and the etchant may include at least one of a hydrofluoric acid (HF) and a diluted hydrofluoric acid (DHF). In an embodiment, in the etchant composition, $HF:H_2O$ may be in a range of 1:2 to 1:10. The etching temperature may be in a range of 20° C. to 25° C.

The specific thickness of the interlayer dielectric layer 202 may be obtained through one or more alternative processes and/or one or more additional processes.

Figure 4C:
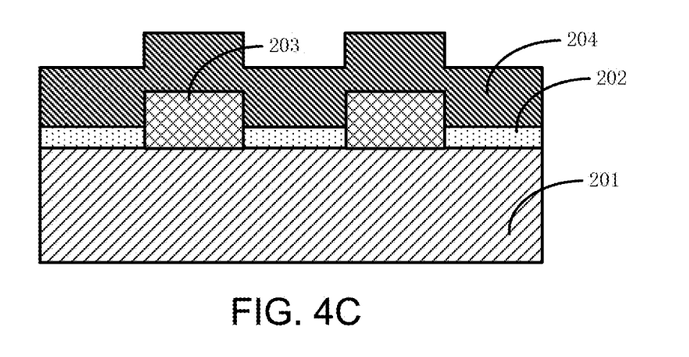

Subsequently, referring to FIG. 6, FIG. 4B, and FIG. 4C, in step 608, a benzocyclobutene (BCB) material layer 204 may be formed on the bonding pads 203 and the interlayer dielectric layer 202. Portions of the BCB material layer 204 may be disposed between bonding pads 203, which protrude over the interlayer dielectric layer 202. The BCB material layer 204 may be formed through. The BCB material layer 204 may be sufficiently photosensitive for subsequent processing. The BCB material layer 204 may have a substantially low stress and may have sufficient plasticity, such that the BCB material layer 204 may effectively reduce the stress in the structure illustrated in FIG. 4C. The BCB material bonding-insulating layers 205 subsequently formed from the BCB material layer 204 may effectively minimize stress in associated structures.

The BCB material may have desirable adhesion with the barrier layers (e.g., oxide barrier layers) and with the bonding pads (e.g., Al pads and/or Cu pads). The BCB material may be desirably fused with underlying dielectric layer 202. In a subsequent process of bonding two wafers, the BCB material bonding-insulating layers 205 may be desirably fused to form a substantially seamless bonding, such that the bonding quality of the wafers may be satisfactory. The BCB material bonding-insulating layers 205 may function as barrier layers to effectively prevent diffusion of conductive bonding pad material (e.g., Cu).

Embodiments of the invention may take advantage of characteristics of the BCB material. The BCB material is an organic material having the molecular formula $C_8H_8$ and can be applied through spin coating. The BCB material may be capable of reflow at a temperature higher than 170° C. The BCB material may have desirable gap-filling capability, which may be important for devices with small critical dimensions. The BCB material may have a substantially low dielectric constant (K) value, for providing sufficient electrical insulation. The BCB material may have substantially low stress and desirable stress-relief properties, such that BCB material bonding-insulating layers 205 may not be damaged during wafer bonding, and such that edges of wafers may also be desirably bonded. The thickness of the BCB material layer 204 and/or the height of the BCB material layer over the dielectric layer 202 may be larger than the portions of the bonding pads 203 that protrude over the dielectric layer 202, such that the bonding pads may be substantially completely covered by the BCB material layer 204.

Figure 4D:
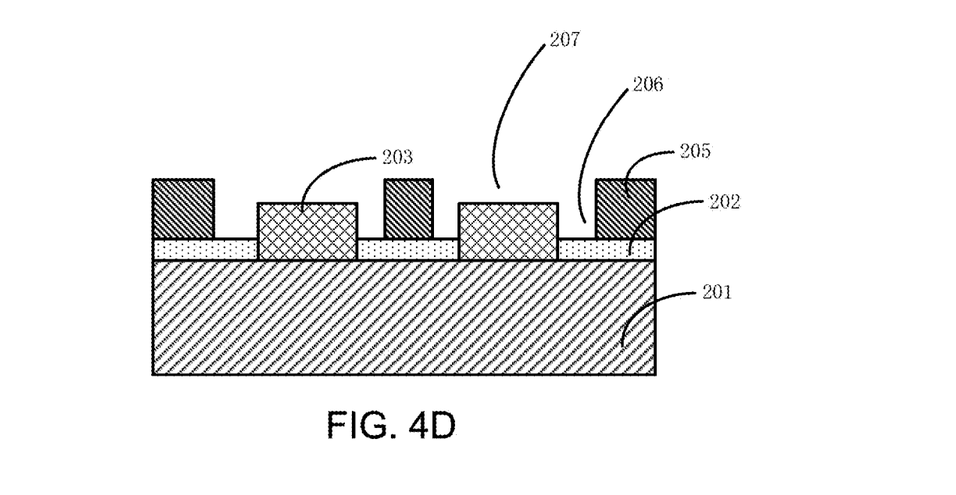

Subsequently, referring to FIG. 6, FIG. 4C, and FIG. 4D, in step 609, the BCB material layer 204 may be patterned (e.g., etched) to remove portions of the BCB material layer that overlap (and cover) the bonding pads 203, such that the bonding pads 203 are exposed through openings 207, and such that BCB material bonding-insulating layer 205 with BCB material portions positioned between bonding pads 203 and/or positioned at edges of the wafer (and/or the edges of the dielectric layer 202) may be formed.

The critical dimensions of the openings 207 may be sufficiently greater than the critical dimensions of respective corresponding bonding pads 203. Therefore, gaps 206 (or recesses 206) may be formed between each bonding pad 203 and BCB material portions of the BCB material bonding-insulating layer 205 that immediately neighbor the bonding pad 203. During Cu—Cu bonding in the process of combining two wafers, the gaps/recesses 206 may accommodate overflowing Cu, such that unwanted electrical connections (or short circuits) may be prevented.

The formation of the openings 207 may include the following steps: forming a mask material layer that includes at least one of a first photoresist layer, an organic distribution layer (ODL), and a silicon-containing bottom antireflective coating (Si-BARC) on the BCB material layer 204; forming a patterned photoresist layer on the mask material layer, wherein a pattern (e.g., openings) of the patterned photoresist layer may define the shape(s) of the opening 207; etching the mask material layer through the pattern of the patterned photoresist layer to form a mask; and etching the BCB material layer 204 using the mask to form the openings 207.

The shape(s) and/or the number of the openings 207 may be determined according to particular embodiments. In an embodiment, the critical dimension of the upper portion of an opening 207 may be equal to the critical dimension of the lower portion of the opening.

The openings 207 may be formed through a dry etching method and/or a wet etching method. In an embodiment, a CF etchant may be used for etching the BCB material layer 204. The C—F etchant may include one or more of $CF_4$, $CHF_3$, $C_4F_8$, and $C_5F_8$. In an embodiment, dry etching may be performed using $CF_4$, $CHF_3$, and at least one of $N_2$, $CO_2$, and $O_2$ to form an etching atmosphere, with the following gas flow rates: a $CF_4$ flow rate in a range of 10 sccm to 200 sccm, a $CHF_3$ flow rate in a range of 10 sccm to 200 sccm, a $N_2$, $CO_2$, and/or $O_2$ flow rate in a range of 210 sccm to 400 sccm. The etching pressure may be in a range of 30 mTorr to 150 mTorr. The etching time duration may be in a range of 5 seconds to 120 seconds. In an embodiment, the etching time duration may be in a range of 5 seconds to 60 seconds. In an embodiment, the etching time duration may be in a range of 5 seconds to 30 seconds. A plurality of openings 207 may be formed substantially simultaneously.

Subsequently, referring to FIG. 6 and FIG. 4D, in step 610, the structure illustrated in FIG. 4D may be cleaned to remove oxides (e.g., a copper oxide) from the surface of the structure (e.g., the surfaces of the bonding pads 203). As a result, a first wafer may be prepared. A second wafer may be prepared using steps analogous to steps 601 to 610. The wafers may be prepared substantially simultaneously.

Subsequently, referring to FIG. 6 and FIG. 5A, in step 611, the first wafer and the second wafer may be combined. The combination of the wafers may involve bonding the BCB material bonding-insulating layer 205 of the first wafer with the BCB material bonding-insulating layer 205 of the second wafer. The combination of the wafers may further involve subsequently bonding the bonding pads 203 of the first wafer with the bonding pads 203 of the second wafer. Each of the bonding pads 203 may be positioned between two neighboring BCB material portions of at least a BCB material bonding-insulating layer 205.

The bonding of the BCB material bonding-insulating layer 205 of the first wafer with the BCB material bonding-insulating layer 205 of the second wafer may involve application of a substantial high pressure on at least one of the wafers toward the other wafer at a temperature in a range of 100° C. to 150° C. for a time duration in a range of 10 minutes to 30 minutes. The pressure may be in a range of 10 kN to 100 kN. In an embodiment, the pressure may be in a range of 30 kN to 60 kN.

After the bonding of the BCB material bonding-insulating layers 205, a low pressure may be applied on at least one of the wafers toward the other wafer for bonding the bonding pads 203 of the first wafer with the bonding pads 203 of the second wafer at a temperature in a range of 300° C. to 400° C. for a time duration in a range of 20 minutes to 60 minutes. The pressure may be in a range of 20 kN to 50 kN. In an embodiment, the pressure may be in a range of 30 kN to 40 kN. The low pressure may prevent excessive deformation and/or conductive material (e.g., Cu) overflow of the bonding pads 203. As a result, a wafer combination may be formed.

Subsequently, referring to FIG. 6, in steps 612, annealing may be performed on the wafer combination. The annealing may be performed at a at a temperature in a range of 300° C. to 800° C. for a time duration in a range of 30 minutes to 90 minutes. The annealing may be performed using at least one of pulsed laser rapid thermal annealing, pulsed electron beam rapid thermal annealing, ion beam rapid thermal annealing, continuous-wave laser rapid thermal annealing, and incoherent broadband light source (e.g., at least one of a halogen lamp, an arc lamp, and graphite heating) rapid thermal annealing, etc. The annealing method may be selected according to particular embodiments.

In an embodiment, a silicone-polymer material may be used instead of the aforementioned BCB material. For bonding silicone-polymer material bonding-insulating layers of two wafers, the temperature may be in a range of 150° C. to 180° C., the pressure may be in a range of 30 kN to 60 kN, and the time duration may be in a range of 10 minutes to 30 minutes.

The silicone-polymer material may have the following chemical formula:

In the chemical formula, the $R_1$ may be an aromatic hydrocarbon, such as one or more of benzene, toluene, o-xylene, m-xylene, p-xylene, ethylbenzene, n-propylbenzene, cumene, biphenyl, naphthalene, etc. and/or one or more associated derivatives. The $R_2$ may be an alkane having a carbon atom count in a range of 1 to 7 and including at least one of a straight chain and a branch chain. The $R_2$ may be an aromatic hydrocarbon. The composition of $R_1$ may be identical or different to the composition of $R_2$. The n may be a natural number n is greater than 1. The molecular weight of the silicone-polymer material may be in a range of 5,000 to 800,000.

FIG. 5B shows schematic cross-sectional views that illustrate portions of two wafers involved in a wafer-level Cu—Cu bonding process in accordance with an embodiment of the present invention. Referring to FIG. 5B and FIG. 6, a first wafer of the two wafers, e.g., the lower wafer illustrated in FIG. 5B, may be prepared using one or more of steps 601 to 610 discussed with references to FIG. 6. Referring to FIG. 5B and FIG. 2, a second wafer of the two wafers, e.g., the upper wafer illustrated in FIG. 5B, may be prepared using one or more steps discussed with reference to FIG. 2. During respective wafer preparation, a bonding-insulating material layer (e.g., a BCB material layer) and a subsequent bonding-insulating layer (e.g., a BCB material bonding-insulating layer 205) may be formed on only one of the two wafers, e.g., the lower wafer.

The prepared first wafer may include bonding pads 203 and a bonding-insulating layer (e.g., a BCB bonding-insulating layer 205) that surrounds the bonding pads 203. Gaps are provided between the bonding pads 203 and the BCB bonding-insulating layer 205.

The prepared second wafer may include bonding pads 203 and an interlayer dielectric layer 202 surrounding the bonding pads 203, without including a BCB material layer.

The process of combining the first wafer with the second wafer may include bonding the BCB bonding-insulating layer 205 of the first wafer with the dielectric layer 202 of the second wafer. The BCB material may have substantially desirable adhesion with the oxide material of the dielectric layer 202. The bonding may involve application of a substantial high pressure on at least one of the wafers toward the other wafer at a temperature in a range of 100° C. to 150° C. for a time duration in a range of 10 minutes to 30 minutes. The pressure may be in a range of 10 kN to 100 kN. In an embodiment, the pressure may be in a range of 30 kN to 60 kN.

In an embodiment, a silicone-polymer material may be used instead of the aforementioned BCB material. For bonding the silicone-polymer material bonding-insulating layer of the first wafer with the dielectric layer 202 of the second wafer, the temperature may be in a range of 150° C. to 180° C., the pressure may be in a range of 30 kN to 60 kN, and the time duration may be in a range of 10 minutes to 30 minutes.

After the bonding of the bonding-insulating layer 205 with the dielectric layer 202, a low pressure may be applied on at least one of the wafers toward the other wafer for bonding the bonding pads 203 of the first wafer with the bonding pads 203 of the second wafer at a temperature in a range of 300° C. to 400° C. for a time duration in a range of 20 minutes to 60 minutes. The pressure may be in a range of 20 kN to 50 kN. In an embodiment, the pressure may be in a range of 30 kN to 40 kN. The low pressure may prevent excessive deformation and/or conductive material (e.g., Cu) overflow of the bonding pads 203. As a result, a wafer combination may be formed.

Steps additional to and/or alternative to the steps discussed with reference to FIG. 2 and FIG. 6 may be performed in accordance with embodiments of the invention.

Embodiments of the invention may be related to semiconductor devices manufactured using one or more steps discussed with references to one or more of FIG. 2 to FIG. 6 and/or alternative or additional steps (e.g., cutting a wafer combination to obtain separated semiconductor devices). Referring to at least one of FIG. 5A and FIG. 5B, an embodiment of the invention may be related to a semiconductor device that may include a first substrate (e.g., a first semiconductor substrate 201) and a second substrate (e.g., a second semiconductor substrate 201). The semiconductor device may further include a first conductive pad and a second conductive pad each being a combination of two conductive pads 203 and each being positioned between the first substrate and the second substrate. The semiconductor device may further include a first dielectric layer 202 formed of a first material (e.g., an oxide), a first portion of the first dielectric layer being positioned between the first conductive pad and the second conductive pad and directly contacting each of the first conductive pad and the second conductive pad. The semiconductor device may further include a second dielectric layer 202, a first portion of the second dielectric layer being positioned between the first conductive pad and the second conductive pad and directly contacting each of the first conductive pad and the second conductive pad. The semiconductor device may further include an insulating layer formed of a second material different from the first material, a first portion of the insulating layer being positioned between the first portion of the first dielectric layer and the first portion of the second dielectric layer and being positioned between the first conductive pad and the second conductive pad. The insulating layer may represent a combination of two insulating layers 205 illustrated in FIG. 5A or may represent the insulating layer 205 illustrated in FIG. 5B. The second material may include at least one of a benzocyclobutene material and a silicone-polymer material. The first portion of the insulating layer may be narrower than the first portion of the first dielectric layer in a direction parallel to an interface between the insulating player and the first dielectric layer. The first portion of the insulating layer may be spaced from all conductive pads of the semiconductor device.

An edge portion of the insulating layer may be positioned at an edge of the semiconductor device, may directly contact each of an edge portion of the first dielectric layer and an edge portion of the second dielectric layer, and may be narrower than the edge portion of the first dielectric layer in a direction parallel to an interface between the insulating layer and the first dielectric layer. The edge portion of the insulating layer may be spaced from all conductive pads of the semiconductor device.

According to embodiments of the invention, the bonding-insulating layer 205 may substantially enhance bonding force and bonding areas between the wafers, such that satisfactory structural robustness may be advantageously provided. The bonding-insulating layer 205 may also prevent unwanted diffusion and electrical connections between bonding pads 203, such that satisfactory device quality and performance may be advantageously provided.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing a semiconductor device, the method comprising:
   providing a first dielectric layer and a first set of conductive pads on a first substrate, each conductive pad of the first set of conductive pads being positioned between portions of the first dielectric layer;
   providing a first insulating material layer to cover the first dielectric layer and the first set of conductive pads; and removing portions of the first insulating material layer to form a first insulating layer, opening of the first insulating layer exposing the first set of conductive pads.

2. The method of claim 1, wherein the first insulating layer includes at least one of a benzocyclobutene material and a silicone-polymer material.

3. The method of claim 1, further comprising:
forming a first dielectric material layer on the first substrate; and
etching the first dielectric material layer to form the first dielectric layer, wherein a thickness of the first dielectric layer is less than a thickness of the first dielectric material layer.

4. The method of claim 1, wherein the first insulating material layer is formed on the first dielectric layer and the first set of conductive pads through spin coating.

5. The method of claim 1, wherein the openings includes a first opening, wherein the first set of conductive pads includes a first conductive pad exposed by the first opening, wherein a critical dimension of the first opening of the first insulating layer is greater than a critical dimension of the first conductive pad, such that a first gap is provided between the first conductive pad and the first insulating layer.

6. The method of claim 1, wherein the first insulating layer does not directly contact the first set of conductive pads.

7. The method of claim 1, wherein a first portion of the first insulating layer is positioned between at least two conductive pads of the first set of conductive pads, wherein a second portion of the first insulating layer directly contacts an edge portion of the first dielectric layer, wherein at least one conductive pad of the first set of conductive pads is positioned between the first portion of the first insulating layer and the second portion of the first insulating layer, and wherein the second portion of the first insulating layer is narrower than the edge portion of the first dielectric layer in a direction parallel to an interface between the first insulating layer and the first dielectric layer.

8. The method claim 1, wherein the removing the portions of first insulating material layer comprises:
forming a mask material layer on the first insulating material layer, the mask material layer including at least one of a first photoresist layer, an organic distribution layer, and a silicon-containing bottom antireflective coating;
forming a patterned photoresist layer on the mask material layer;
etching the mask material layer using the patterned photoresist layer to form a mask; and
etching the first insulating material layer using the mask.

9. The method of claim 1, wherein a height of the first insulating layer with respect to the first substrate is greater than a height of the first set of conductive pads with respect to the first substrate.

10. The method of claim 1, further comprising:
providing a second dielectric layer and a second set of conductive pads on a second substrate, each conductive pad of the second set of conductive pads being positioned between portions of the second dielectric layer;
providing a second insulating material layer to cover the second dielectric layer and the second set of conductive pads; and
removing portions of the second insulating material layer to form a second insulating layer, opening of the second insulating layer exposing the second set of conductive pads;
connecting the first insulating layer to the second insulating layer; and
after the connecting the first insulating layer to the second insulating layer, connecting the first set of conductive pads to the second set of conductive pads.

11. The method of claim 10,
wherein at least one of the first insulating layer and the second insulating layer is formed of benzocyclobutene, and
wherein the connecting the first insulating layer to the second insulating layer is performed at a temperature in a range of 100° C. to 150° C. for a time duration in a range of 10 minutes to 30 minutes using a pressure in a range of 30 kN to 60 kN.

12. The method of claim 10,
wherein at least one of the first insulating layer and the second insulating layer is formed of a silicone-polymer material, and
wherein the connecting the first insulating layer to the second insulating layer is performed at a temperature in a range of 150° C. to 180° C. for a time duration in a range of 10 minutes to 30 minutes using a pressure in a range of 30 kN to 60 kN.

13. The method of claim 10, wherein the connecting the first set of conductive pads to the second set of conductive pads is performed at a temperature in a range of 300° C. to 400° C. for a time duration in a range of 20 minutes to 60 minutes using a pressure in a range of 30 kN to 40 kN.

14. The method of claim 1, further comprising:
providing a second dielectric layer and a second set of conductive pads on a second substrate, each conductive pad of the second set of conductive pads being disposed between portions of the second dielectric layer;
connecting the first insulating layer to the second dielectric layer; and
after the connecting the first insulating layer to the second dielectric layer, connecting the first set of conductive pads to the second set of conductive pads.

15. The method of claim 14,
wherein the first insulating layer is formed of benzocyclobutene, and
wherein the connecting the first insulating layer to the second insulating layer is performed at a temperature in a range of 100° C. to 150° C. for a time duration in a range of 10 minutes to 30 minutes using a pressure in a range of 30 kN to 60 kN.

16. The method of claim 14,
wherein the first insulating layer is formed of a silicone-polymer material, and
wherein the connecting the first insulating layer to the second insulating layer is performed at a temperature in a range of 150° C. to 180° C. for a time duration in a range of 10 minutes to 30 minutes using a pressure in a range of 30 kN to 60 kN.

* * * * *